United States Patent
Ono

(10) Patent No.: US 6,246,292 B1
(45) Date of Patent: Jun. 12, 2001

(54) PHASE LOCK LOOP CIRCUIT WITH AUTOMATIC SELECTION OF OSCILLATION CIRCUIT CHARACTERISTICS

(75) Inventor: Naoki Ono, Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/459,340

(22) Filed: Dec. 13, 1999

(30) Foreign Application Priority Data

Dec. 15, 1998 (JP) .................................. 10-356320

(51) Int. Cl.[7] ............................. G09G 1/04; H03L 7/099; H04N 5/04
(52) U.S. Cl. ................... 331/2; 331/10; 331/16; 331/20; 331/25; 348/540
(58) Field of Search ..................... 331/2, 10, 11, 331/14, 16, 20, 25; 348/540, 542

(56) References Cited

U.S. PATENT DOCUMENTS 4,958,228 * 9/1990 Kutsuki .............................. 331/20
5,184,091 * 2/1993 Srivastava ......................... 331/20
5,777,520 * 7/1998 Kawakami ......................... 331/20

FOREIGN PATENT DOCUMENTS

| 7303041 | 11/1995 | (JP) . |
| 9153799 | 6/1997 | (JP) . |
| 9162730 | 6/1997 | (JP) . |

* cited by examiner

*Primary Examiner*—Siegfried H. Grimm
(74) *Attorney, Agent, or Firm*—Leydig, Voit & Mayer, Ltd.

(57) ABSTRACT

A phase lock loop (PLL) circuit has an oscillation circuit operating in synchronism with a horizontal synchronizing signal. The PLL circuit also has a DC level decision circuit for deciding the DC level of a vertical synchronizing signal during a return period, and a logic circuit for automatically selecting the oscillation circuit according to the DC level decided in the DC level decision unit. Thus, even if there is an increase in the oscillation characteristics, this PLL circuit can automatically select the necessary oscillation characteristics without a need for expanding an operation frequency of a voltage controlled oscillation circuit.

8 Claims, 8 Drawing Sheets

6,246,292 B1

PHASE LOCK LOOP CIRCUIT WITH AUTOMATIC SELECTION OF OSCILLATION CIRCUIT CHARACTERISTICS

FIELD OF THE INVENTION

The present invention relates to a phase lock loop circuit (hereinafter to be referred to as a PLL circuit) for generating a dot clock frequency according to a resolution in order to display characters or image information on a multi-scan monitoring screen corresponding to horizontal and vertical synchronizing signals.

BACKGROUND OF THE INVENTION

FIG. 8 is a block diagram that shows an example of a conventional PLL circuit shown in Japanese Patent Application Laid-open Publication No. HEI 9-153799. As shown in FIG. 8, this PLL circuit 1000 includes a phase comparator 1100, a loop filter 1200, a voltage controlled oscillation (VCO) circuit 1300, a frequency-dividing circuit 1400, and a frequency detecting circuit 1500. A horizontal synchronizing signal fH and a reference signal fr from the frequency-dividing circuit 1400 are input into the phase comparator 1100. The phase comparator 1100 then supplies detected signals to the loop filter 1200. A control signal VL output from the loop filter 1200 is input into the VCO oscillation circuit 1300. The VCO oscillation circuit 1300 then outputs a frequency signal nfH that is n times of the frequency of the horizontal synchronizing signal fH. Further, the horizontal synchronizing signal fH and a clock signal CL are input into the frequency detecting circuit 1500. The frequency detecting circuit 1500 outputs a characteristics change-over signal MSn for changing over the oscillation characteristics of the VCO oscillation circuit 1300.

FIG. 9 shows the operation of the VCO oscillation circuit 1300. Based on the oscillation characteristics changed over by the VCO oscillation circuit, the VCO oscillation circuit 1300 carries out an oscillation operation in a predetermined frequency according to the control signal VL output from the loop filter 1200.

Accordingly, for obtaining oscillation characteristics over a wide range, the VCO oscillation circuit 1300 is operated in a frequency area as shown by a broken line in FIG. 9. Thus, a wider dynamic range is realized.

According to the above-described conventional PLL circuit, however, when there is an increase in the oscillation characteristics, it is necessary to expand the operation frequency area of the VCO oscillation circuit along with this increase. Thus, the operation becomes unstable, and it becomes difficult to automatically select necessary oscillation characteristics.

SUMMARY OF THE INVENTION

In the PLL circuit according to a first aspect of the present invention, a DC level decision unit decides the DC level of a vertical synchronizing signal during a return period, and a logic circuit automatically selects an oscillation circuit according to the DC level decided in the DC level decision unit. Therefore, it is possible to automatically select the oscillation circuit having necessary oscillation characteristics.

In the PLL circuit according to a second aspect of the present invention, a DC level decision unit decides the DC level of a signal obtained during a period when a display of display information on a monitoring screen is off, and a logic circuit automatically selects an oscillation circuit according to the DC level decided in the DC level decision unit. Therefore, it is possible to automatically select the oscillation circuit having necessary oscillation characteristics.

In the PLL circuit according to a third aspect of the present invention, a frequency-dividing circuit divides the frequency of a clock, a phase comparator compares the phase of a clock frequency-divided by the frequency-dividing circuit with the phase of a horizontal synchronizing signal, a charge pump circuit charges up or discharges, by receiving an error signal output from the phase comparator, a loop filter receives the output data from the charge pump circuit, a DC level decision circuit decides the DC level of the signal output from the loop filter, a logic circuit receives the output data from the DC level decision circuit, and finally an oscillation circuit outputs oscillation characteristics according to the output signal from the logic circuit and the loop filter. Therefore, it is possible to automatically select the oscillation circuit having necessary oscillation characteristics.

Other objects and features of this invention will become apparent from the following description with reference to the accompanying drawings.

DESCRIPTION OF THE PREFERRED EMBODIMENTS

Figure 1:
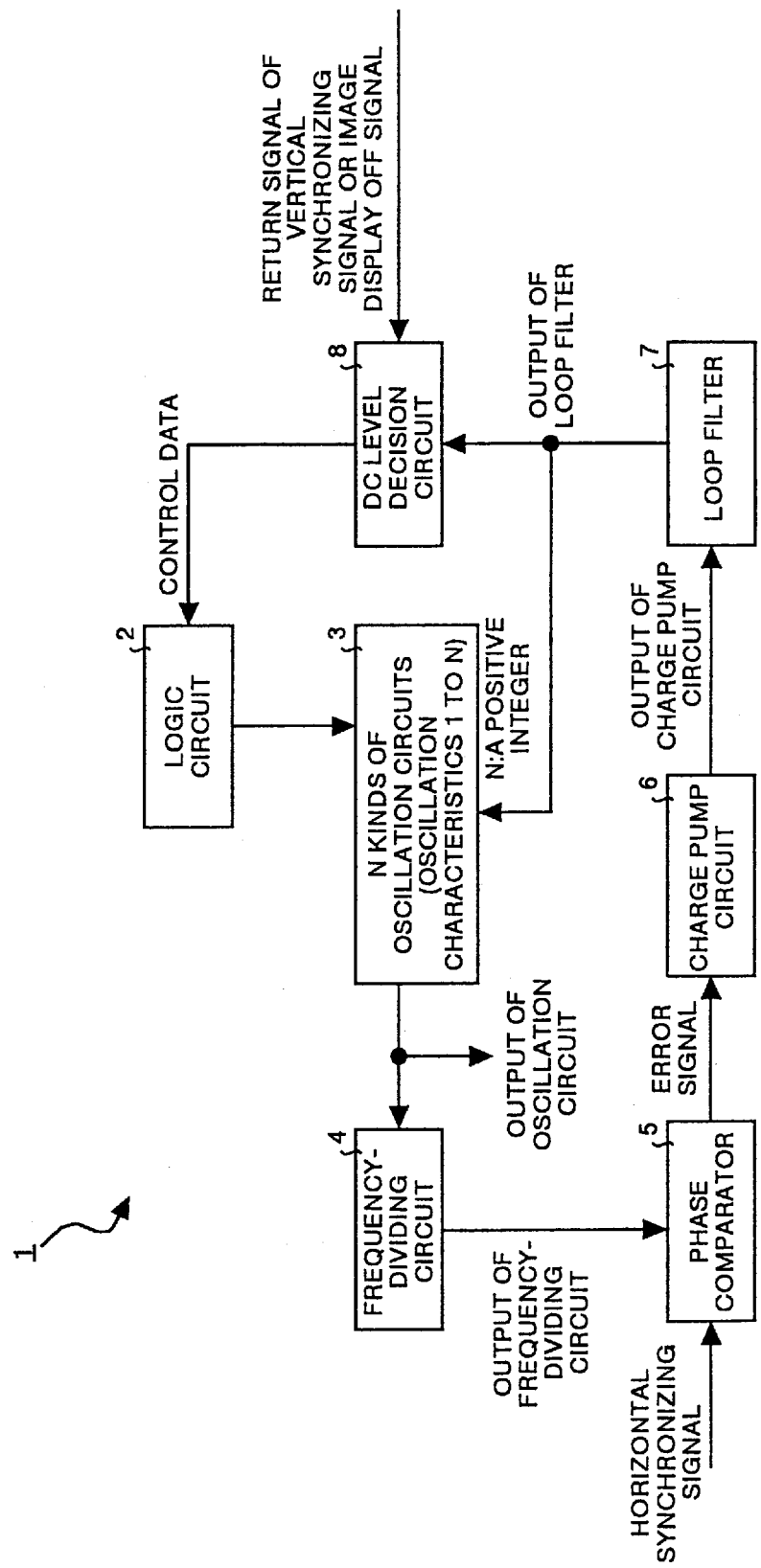
FIG. 1 is a block diagram of a PLL circuit according to a first embodiment of the present invention.

There will be explained in detail below embodiments of the present invention with reference to the drawings. FIG. 1 is a block diagram of a PLL circuit according to a first embodiment of the present invention. Referring to FIG. 1, this PLL circuit 1 includes a logic circuit 2 for selecting N kinds of oscillation circuits (where N is a positive integer) incorporated in the PLL circuit 1 by control data transmitted from a DC level decision circuit 8, an oscillation circuit 3 having N kinds of oscillation characteristics, a frequency-dividing circuit 4 for frequency-dividing a clock output from the oscillation circuit 3, a phase comparator 5 for comparing the frequency of a horizontal synchronizing signal with the frequency of a clock frequency-divided by the frequency-dividing circuit 4, a charge pump circuit 6 for charging up to or discharging from a next-stage loop filter a phase difference component output from the phase comparator 5 as a DC level, a loops filter 7 for removing a higher harmonic component or determining dynamic characteristics of the PLL circuit 1, and a DC level decision circuit 8 for deciding a DC level obtained by the loop filter 7.

Figure 2:
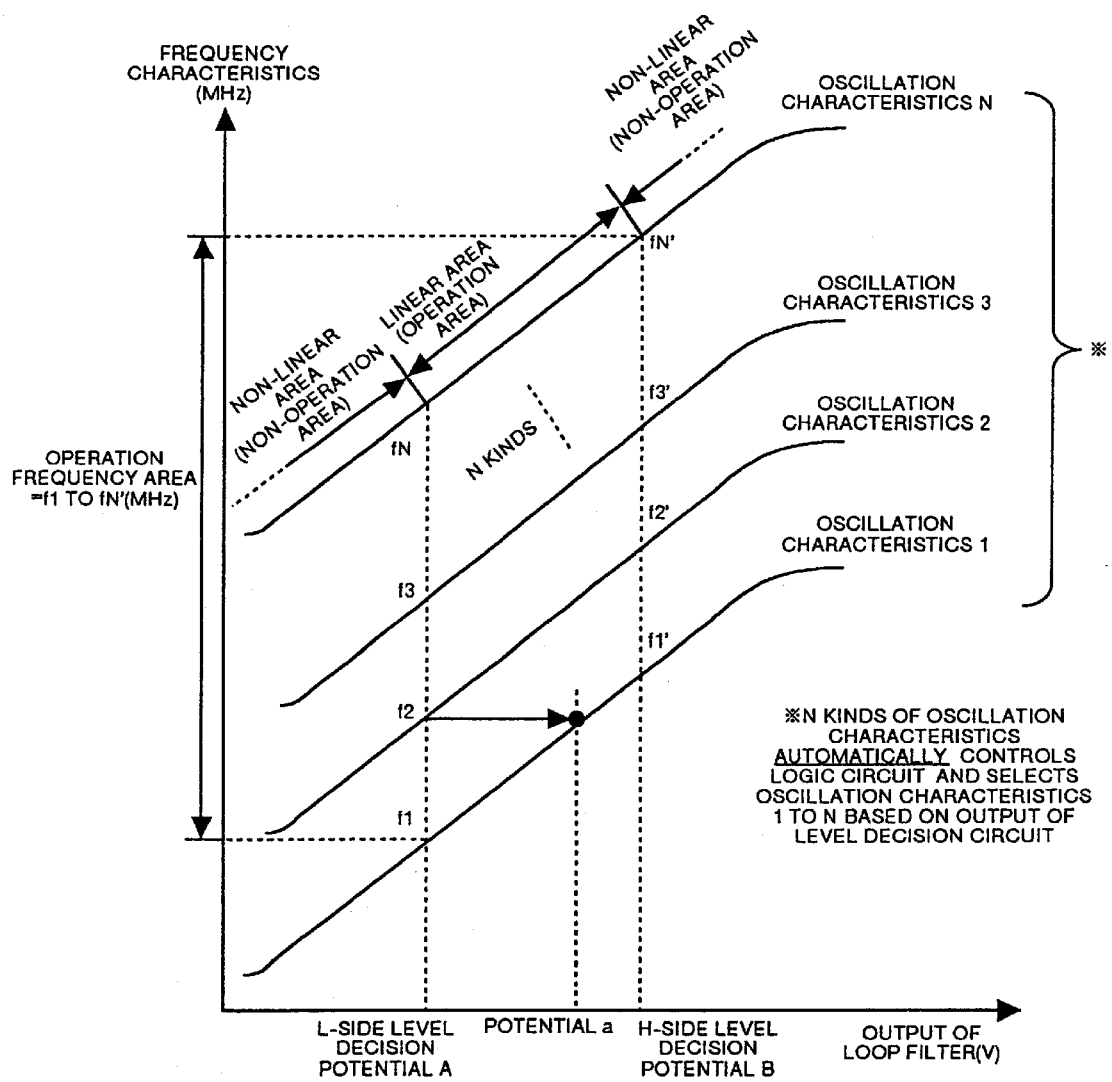
FIG. 2 is a diagram showing oscillation characteristics of the PLL circuit according to the first embodiment of the invention.

FIG. 2 is a diagram showing oscillation characteristics of the PLL circuit 1. The operation of the PLL circuit 1 will be explained below with reference to FIG. 2. At first, the DC level decision circuit 8 decides an output level of the loop filter 7, and transmits a result of this decision to the logic circuit 2 as control data. The oscillation circuit 3 has its effective N kinds of oscillation characteristics selected automatically according to the control data of the logic circuit 2. When a DC level exceeds a DC level decision potential A that is an L-side limit point of a linear area of the oscillation characteristics shown in FIG. 2, the DC level decision circuit 8 automatically changes the oscillation characteristics from oscillation characteristics 2 to oscillation characteristics 1 in the logic circuit 2. Thus, it is possible to obtain oscillation characteristics without changing the frequency f2 such that an oscillation frequency is generated within the linear area.

Further, this PLL circuit 1 relates to the one for displaying characters or image information on a multi-scan monitoring screen. Accordingly, for changing the oscillation characteristics, the DC level decision circuit 8 operates only during a return period of a vertical synchronizing signal or during a period while a screen display is off.

Figure 3:
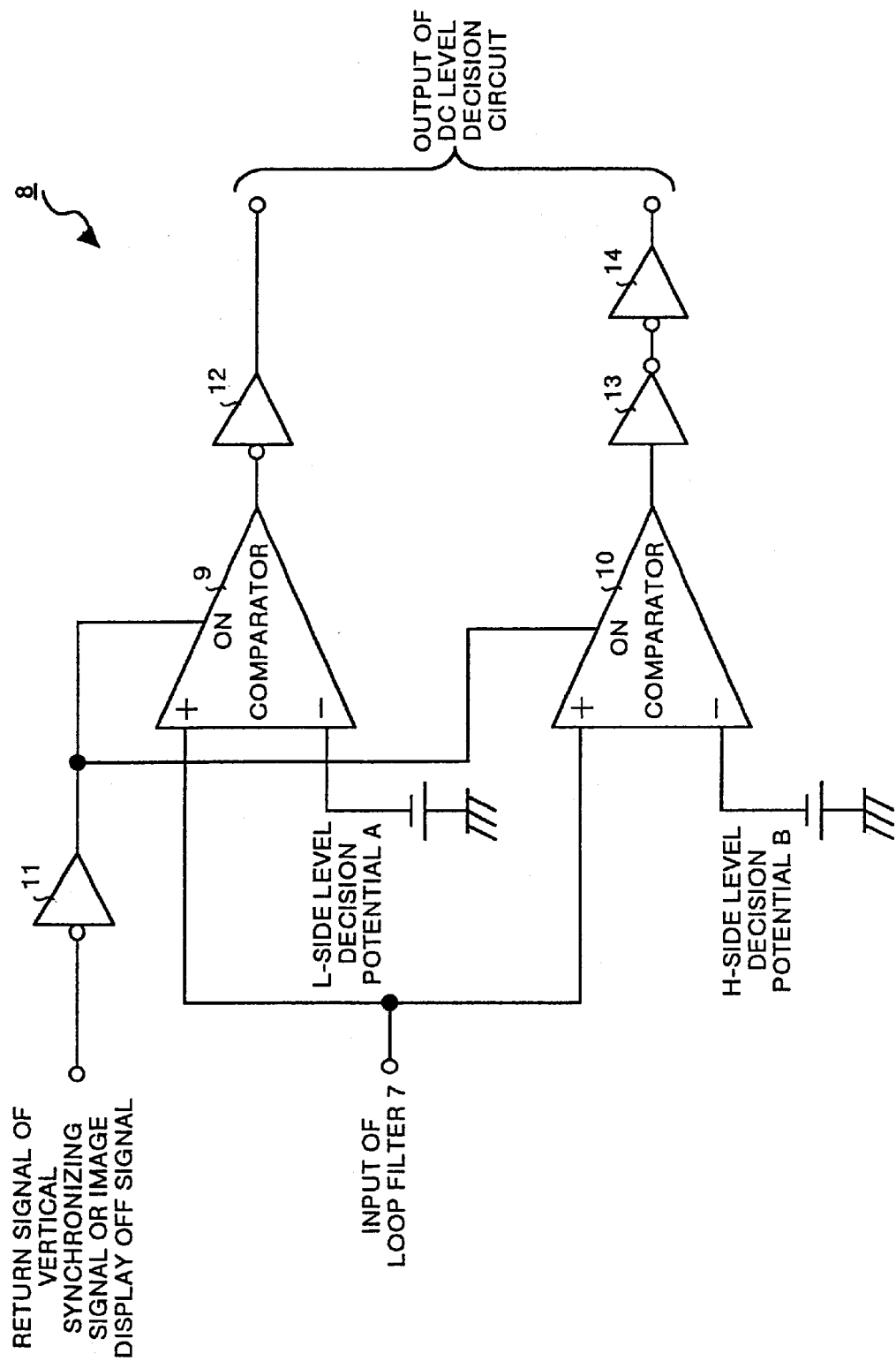
FIG. 3 is a diagram showing a DC level decision circuit of the PLL circuit according to the first embodiment of the invention.

FIG. 3 shows a concrete example of the DC level decision circuit 8. Referring to FIG. 3, reference numeral 9 denotes a comparator for making a decision of a DC level at the L-side of the output of the loop filter 7, 10 denotes a comparator for making a decision of a DC level at an H-side, and reference numerals 11 to 14 denote inverter circuits for carrying out a polarity inversion operation.

The operation of the DC level decision circuit 8 will be explained below. The comparators 9 and 10 are structured to operate only during a return period of a vertical synchronizing signal or during an off period of a screen display. The comparators 9 and 10 operate such that when a DC level is lower than the L-side decision potential of the output of the loop filter 7, the output of the inverter circuit 12 becomes H level, when a DC level exceeds the H-side decision level of the output of the loop filter 7, the output of the inverter circuit 14 becomes at the H level, and when the output potential of the loop filter 7 is between the decision potentials A and B, both the inverter circuits 12 and 14 are at the L-level output.

Figure 4:
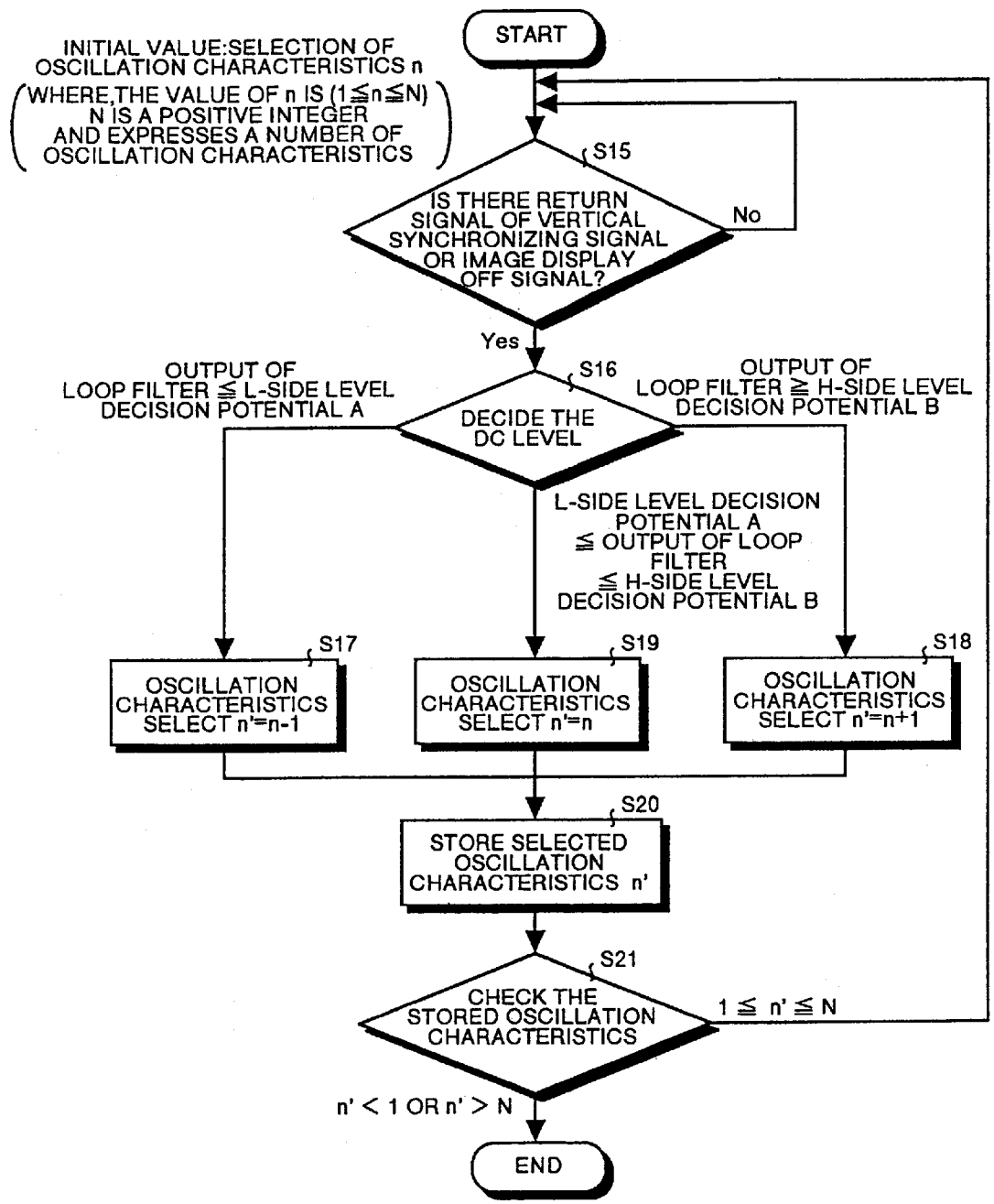
FIG. 4 is an operation flowchart of the DC level decision circuit and a logic circuit of the PLL circuit according to the first embodiment of the invention.

FIG. 4 is an operation flowchart of the DC level decision circuit 8 and the logic circuit 2. The operation of these circuits will be explained below with reference to FIG. 4. At first, an initial value is set from oscillation characteristics n, where n is in the relationship of $1 \leq n \leq N$ (where N is a positive integer). In step S15, a decision is made as to whether the oscillation characteristics n is within a return period of a vertical synchronizing signal or within an off period of a screen display. When the result of the decision is YES, the process proceeds to step S16 where a DC level is decided. When the result of the decision is NO, the process returns to the start without deciding the DC level. In step S16 if it is decided that the output of the loop filter 7 is in the relationship of the loop filter output$\leq$the L-side level decision potential A then the oscillation characteristics n'=n−1 is selected in step S17. In step S16 if it is decided that the output of the loop filter 7 is in the relationship of the loop filter output$\geq$the H-side level decision potential B then the oscillation characteristics n'=n+1 is selected in step S18.

Further, In step S16 if it is decided that the output of the loop filter 7 is in the relationship of the L-side level decision potential A$\leq$the loop filter output$\leq$the H-side level decision potential B then oscillation characteristics n'=n is selected in step S19. The selected oscillation characteristics n' are stored in step S20. When the stored oscillation characteristics n' is in the relationship of $1 \leq n' \leq N$ (where N is a positive integer) in step S21, the process returns to the start. Further, when the oscillation characteristics n' is in the relationship of n'<1, or n'>N, there exists no oscillation characteristics, and thus the process finishes.

According to the first embodiment, it is not necessary to program by a microcomputer the control of N kinds of oscillation circuits incorporated within the PLL circuit and to select an oscillation circuit, but it is possible to control the logic circuit by the DC level decision circuit unit and to automatically select an oscillation circuit having necessary oscillation characteristics. Further, as the DC level decision circuit unit automatically selects an oscillation circuit during a return period of a vertical synchronizing signal or during an off period of a screen display, it is possible to obtain a PLL circuit having little problem of a distortion in the display of information on the screen.

Figure 5:
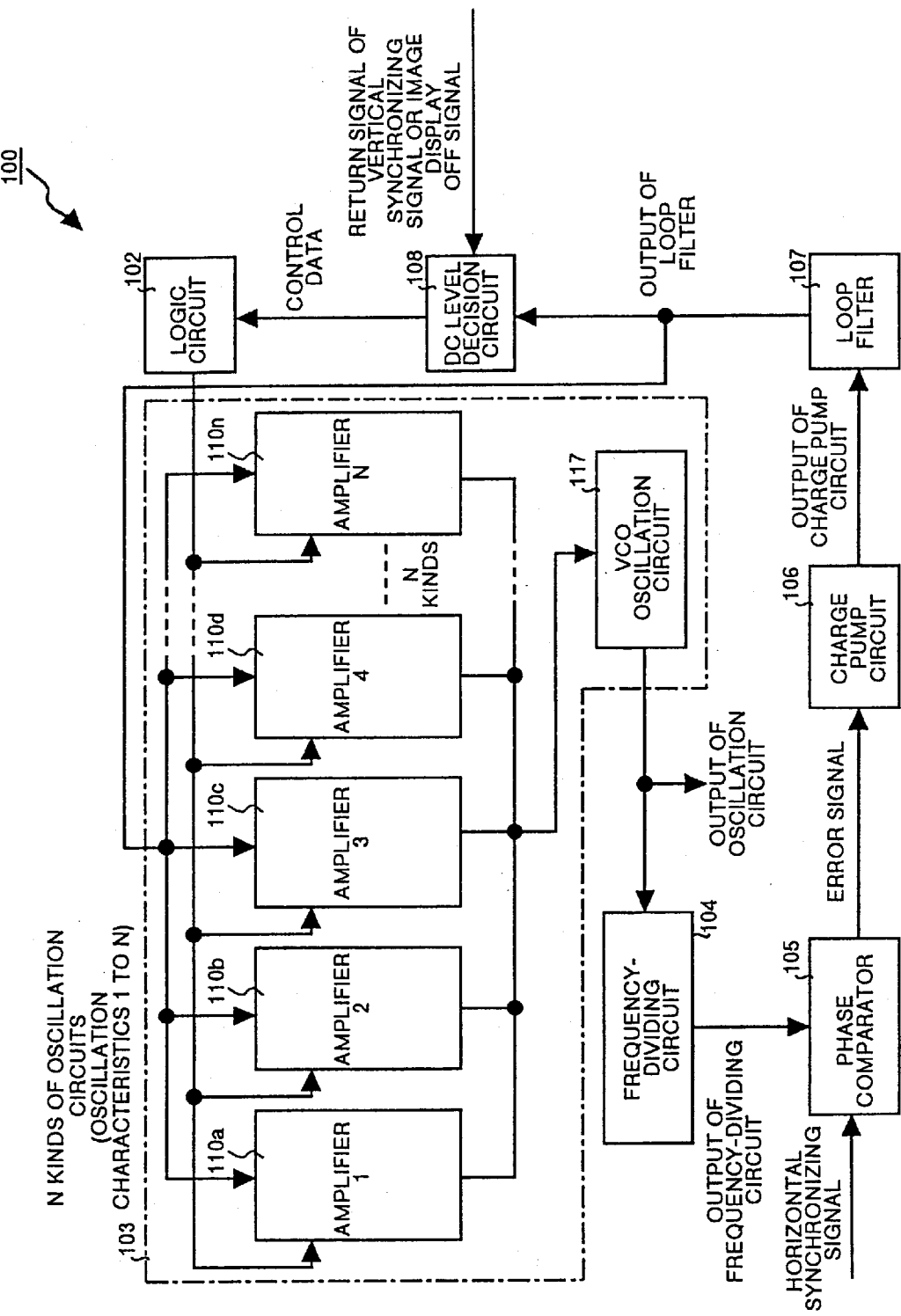
FIG. 5 is a block diagram of a PLL circuit according to a second embodiment of the present invention.

FIG. 5 is a block diagram of a PLL circuit according to a second embodiment of the present invention. Referring to FIG. 5, this PLL circuit 100 includes a logic circuit 102 for selecting N kinds of oscillation circuits (where N is a positive integer) incorporated in the PLL circuit by control data transmitted from a DC level decision circuit 108, an oscillation circuit 103 having N amplifiers 110a to 110n and for outputting N kinds of oscillation characteristics by a VCO oscillation circuit 117 to which signals are input from these amplifiers, a frequency-dividing circuit 104 for frequency-dividing a clock output from the oscillation circuit 117, a phase comparator 105 for comparing the frequency of a horizontal synchronizing signal with the frequency of a clock frequency-divided by the frequency-dividing circuit 104, a charge pump circuit 106 for charging up to or discharging from a next-stage loop filter a phase difference component output from the phase comparator 105 as a DC level, a loop filter 107 for removing a higher harmonic component or determining dynamic characteristics of the PLL circuit, and the DC level decision circuit 108 for deciding a DC level obtained by the loop filter 107.

The operation of the PLL circuit 100 will be explained below. The DC level decision circuit 108 decides an output level of the loop filter 107, and transmits a result of this decision to the logic circuit 102 as control data. The control data of the logic circuit 102 and the output of the loop filter 107 are transmitted to the respective amplifiers 110a to 10n. Then, signals from these amplifiers 110a to 10n are input into the VCO oscillation circuit 117, which automatically outputs effective N kinds of oscillation characteristics.

The operation of the PLL circuit 100 having the above-described structure is almost similar to that of the PLL circuit 1 according to the first embodiment. However, as the PLL circuit 100 is equipped with the VCO oscillation circuit 117, voltage/frequency conversion characteristics are more linear. Further, the voltage/frequency conversion is large, and the stability of the oscillation frequency is satisfactory in a long-time oscillation operation. Furthermore, it is possible to oscillate in a high-frequency area, and it is easy to adjust the frequency.

Figure 6:
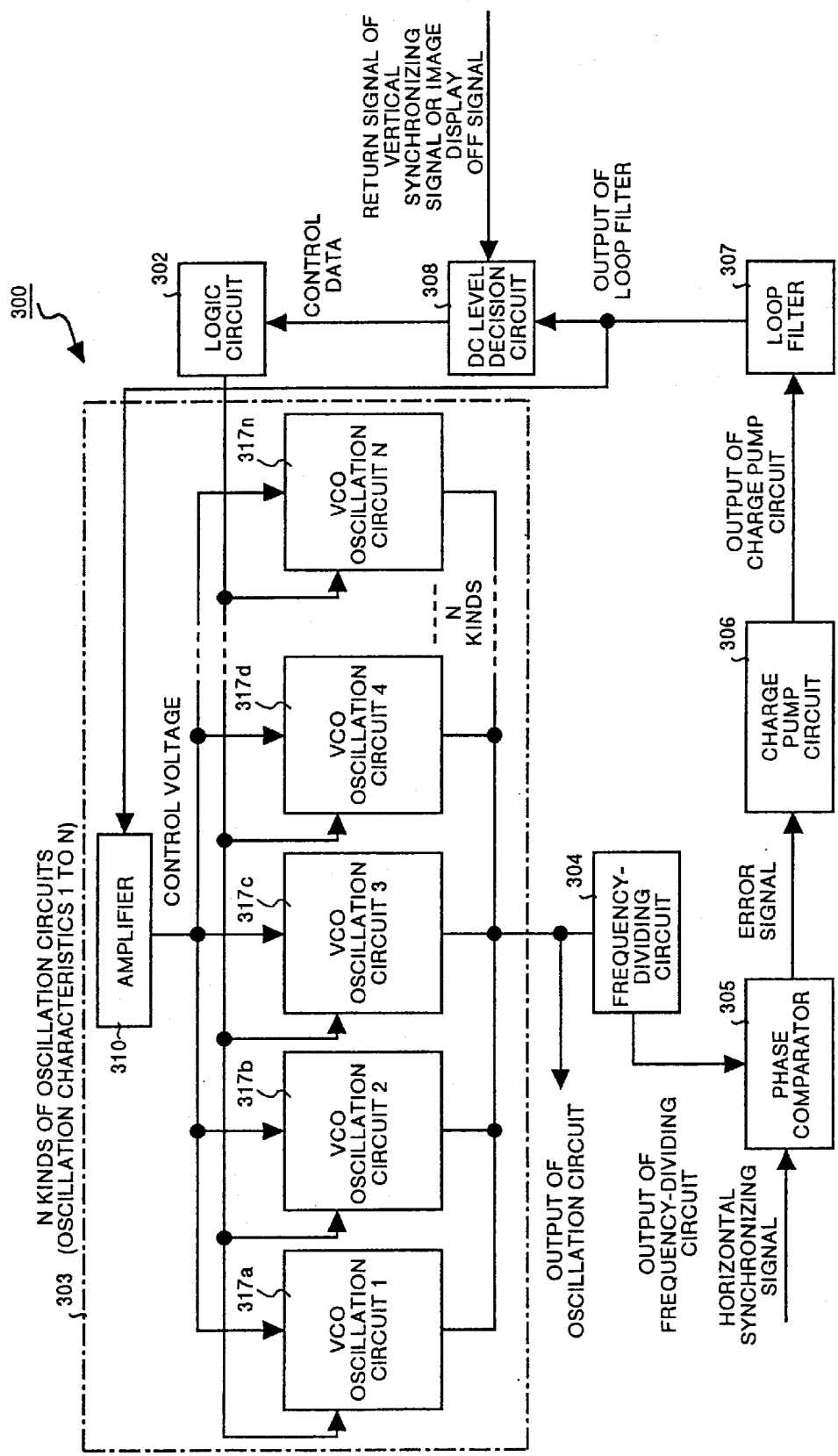
FIG. 6 is a block diagram of a PLL circuit according to a third embodiment of the present invention.

FIG. 6 is a block diagram of a PLL circuit according to a third embodiment of the present invention. Referring to FIG. 6, this PLL circuit 300 includes a logic circuit 302 for selecting N kinds of oscillation circuits (where N is a positive integer) incorporated in the PLL circuit according to the control data transmitted from a DC level decision circuit 308, an oscillation circuit 303 having an amplifier 310 that outputs a signal to each of the N number of VCO oscillation circuits 317a to 317n so as to obtain N kinds of oscillation characteristics, a frequency-dividing circuit 304 for frequency-dividing a clock output from the oscillation circuit 303, a phase comparator 305 for comparing the frequency of a horizontal synchronizing signal with the frequency of a clock frequency-divided by the frequency-dividing circuit 304, a charge pump circuit 306 for charging up to or discharging from a next-stage loop filter a phase difference component output from the phase comparator 305 as a DC level, a loop filter 307 for removing a higher harmonic component or determining dynamic characteristics of the PLL circuit, and the DC level decision circuit 308 for deciding a DC level obtained by the loop filter 307.

The operation of the PLL circuit 300 will be explained below. The DC level decision circuit 308 decides an output level of the loop filter 307, and transmits a result of this decision to the logic circuit 302 as control data. The output of the loop filter 307 is transmitted to the amplifier 310. Then, a signal from the amplifier 310 and the control data of the logic circuit 302 are input into the VCO oscillation circuits 317a to 317n, which automatically output effective N kinds of oscillation characteristics.

The operation of the PLL circuit 300 having the above-described structure is almost similar to that of the PLL circuit 100 according to the second embodiment. However, as the PLL circuit 300 is equipped with N number of VCO oscillation circuits 317a to 317n, voltage/frequency conversion characteristics are more linear as compared with those of the PLL circuit 100. Further, the voltage/frequency conversion is large, and the stability of the oscillation frequency is satisfactory in a long-time oscillation operation. Furthermore, it is possible to oscillate in a high-frequency area, and it is easy to adjust the frequency.

Figure 7:
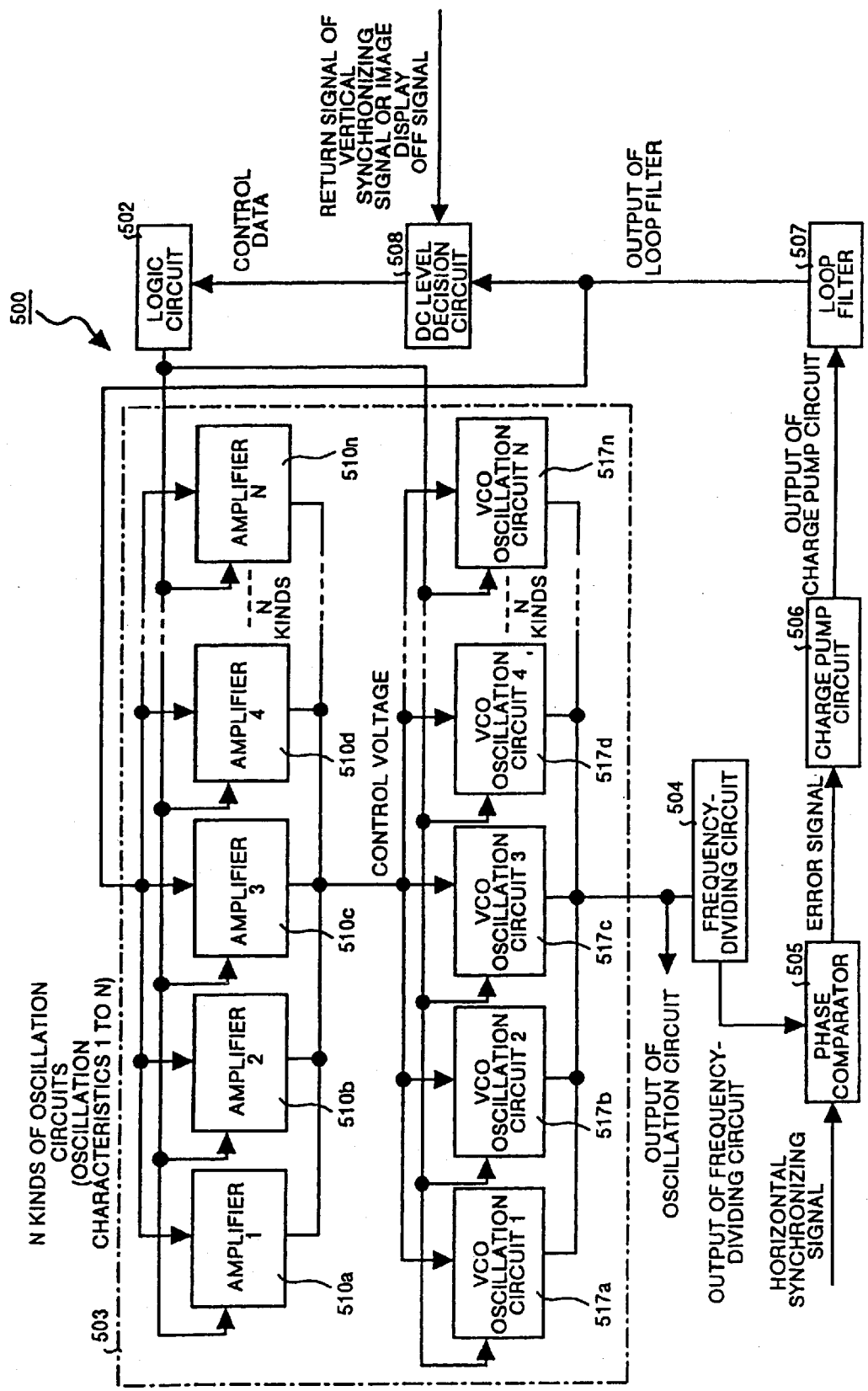
FIG. 7 is a block diagram of a PLL circuit according to a fourth embodiment of the present invention.
Figure 8:
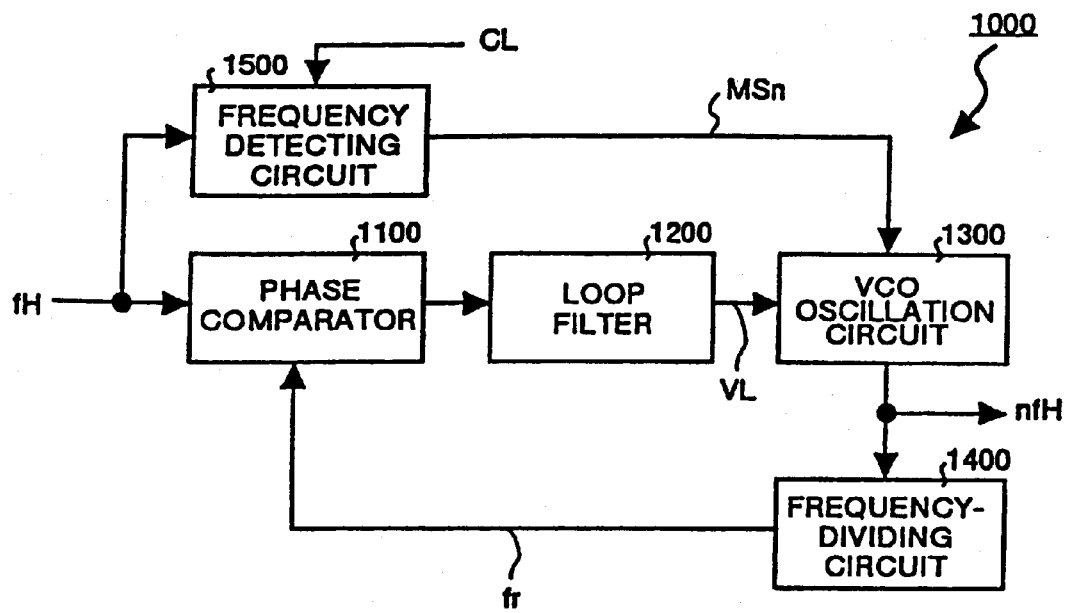
FIG. 8 is a block diagram of a conventional PLL circuit.
Figure 9:
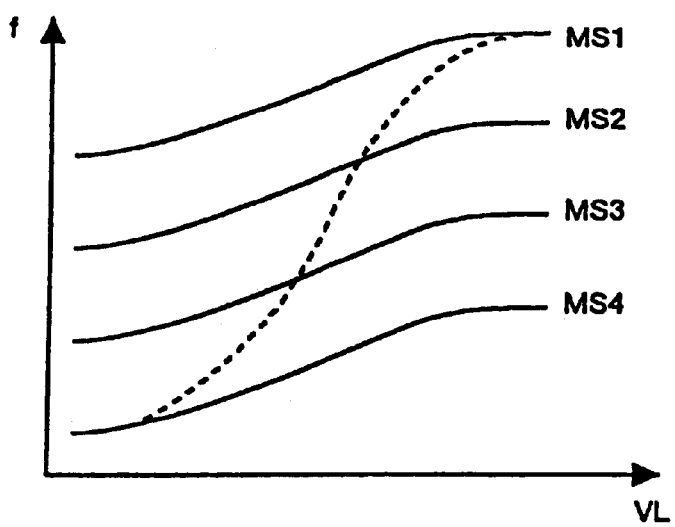
FIG. 9 is a diagram showing oscillation characteristics of a VCO oscillate ion circuit of the conventional PLL circuit.

FIG. 7 is a block diagram of a PLL circuit according to a fourth embodiment of the present invention. Referring to FIG. 7, this PLL circuit 500 includes a logic circuit 502 for selecting N kinds of oscillation circuits (where N is a positive integer) incorporated in the PLL circuit according to the control data transmitted from a DC level decision circuit 508, an oscillation circuit 503 having N number of amplifiers 510a to 510n that output a signal to each of the N number of VCO oscillation circuits 517a to 517n so as to obtain N kinds of oscillation characteristics, a frequency-dividing circuit 504 for frequency-dividing a clock output from the oscillation circuit 503, a phase comparator 505 for comparing the frequency of a horizontal synchronizing signal with the frequency of a clock frequency-divided by the frequency-dividing circuit 504, a charge pump circuit 506 for charging up to or discharging from a next-stage loop filter a phase difference component output from the phase comparator 505 as a DC level, a loop filter 507 for removing a higher harmonic component or determining dynamic characteristics of the PLL circuit, and the DC level decision circuit 508 for deciding a DC level obtained by the loop filter 507.

The operation of the PLL circuit 500 will be explained below. The DC level decision circuit 508 decides an output level of the loop filter 507, and transmits a result of this decision to the logic circuit 502 as control data. The output of the loop filter 507 and the control data of the logic circuit 502 are transmitted to each of the amplifiers 510a to 510n. Then, signals from the N amplifiers 510a to 510n and the control data of the logic circuit 502 are input into the VCO oscillation circuits 517a to 517n, which automatically output effective N kinds of oscillation characteristics.

The operation of the PLL circuit 500 having the above-described structure is almost similar to that of the PLL circuit 300 according to the third embodiment. However, as the PLL circuit 500 is equipped with the N number of amplifiers 510a to 510n and the N number of VCO oscillation circuits 517a to 517n, voltage/frequency conversion characteristics are more linear as compared with those of the PLL circuit 300. Further, the voltage/frequency conversion is large, and the stability of the oscillation frequency is satisfactory in a long-time oscillation operation. Furthermore, it is possible to oscillate in a high-frequency area, and it is easy to adjust the frequency.

According to the present invention, in an integrated circuit apparatus, a PLL circuit having an oscillation circuit operating in synchronism with a horizontal synchronizing signal includes a unit for automatically selecting the oscillation circuit by controlling a logic circuit by a DC level decision unit during a return period of a vertical synchronizing signal. Therefore, it is possible to obtain a PLL circuit in which it is not necessary to program by a microcomputer the control of N kinds of oscillation circuits incorporated within the PLL circuit and to select an oscillation circuit, but it is possible to control the logic circuit by the DC level decision circuit unit and to automatically select an oscillation circuit having necessary oscillation characteristics.

Further, according to the present invention, a PLL circuit having an oscillation circuit operating in synchronism with a horizontal synchronizing signal includes a unit for automatically selecting the oscillation circuit by controlling a logic circuit by a DC level decision unit during a period while a display of display information on a monitoring screen is off. Therefore, it is possible to obtain a PLL circuit in which it is not necessary to program by a microcomputer the control of N kinds of oscillation circuits incorporated within the PLL circuit and to select an oscillation circuit, but it is possible to control the logic circuit by the DC level decision circuit unit and to automatically select an oscillation circuit having necessary oscillation characteristics, with stable display information on the screen.

Further, according to the present invention, in a PLL circuit of the first or the second aspect of the invention, the oscillation circuit includes an amplifier and a VCO oscillation circuit to which a signal is input from the amplifier. Therefore, it is possible to obtain a PLL circuit in which voltage/frequency conversion characteristics become more linear, the voltage/frequency conversion is large, and the stability of the oscillation frequency is satisfactory in a long-time oscillation operation, and furthermore, it is possible to oscillate in a high-frequency area, with an easy adjustment of the frequency.

Further, according to the present invention, in a PLL circuit of the third aspect of the invention, the oscillation circuit includes a single or a plurality of amplifiers and VCO oscillation circuits. Therefore, it is possible to obtain a PLL circuit in which voltage/frequency conversion characteristics become more linear, the voltage/frequency conversion is large, and the stability of the oscillation frequency is satisfactory in a long-time oscillation operation, and furthermore, it is possible to oscillate in a high-frequency area, with an easy adjustment of the frequency.

Further, according to the present invention, a PLL circuit includes a frequency-dividing circuit for dividing the frequency of a clock, a phase comparator for comparing the phase of a clock frequency-divided by the frequency-dividing circuit with the phase of a horizontal synchronizing signal, a charge pump circuit for charging up or discharging, by inputting an error signal to be output from the phase comparator, a loop filter for being applied with an input of output data from the charge pump circuit, a DC level decision circuit for making a decision by having an input of an output signal from the loop filter, a logic circuit for being applied with an input of output data from the DC level decision circuit, and an oscillation circuit for outputting oscillation characteristics by having an input of an output signal from the logic circuit and an output signal from the loop filter. Therefore, it is possible to obtain a PLL circuit in which it is not necessary to program by a microcomputer the control of N kinds of oscillation circuits incorporated within the PLL circuit and to select an oscillation circuit, but it is possible to control the logic circuit by the DC level decision circuit unit and to automatically select an oscillation circuit having necessary oscillation characteristics, and further in which, a DC level decision circuit unit automatically selects an oscillation circuit during a return period of a vertical synchronizing signal or during an off period of a screen display, with stable display information on the screen.

Further, according to the present invention, in a PLL circuit of the preceding aspect, the oscillation circuit includes a single or a plurality of amplifiers and VCO oscillation circuits. Therefore, it is possible to obtain a PLL circuit In which voltage/frequency conversion characteristics become more linear, the voltage/frequency conversion is large, and the stability of the oscillation frequency is satisfactory in along-time oscillation operation, and furthermore, it is possible to oscillate in a high-frequency area, with an easy adjustment of the frequency.

Although the invention has been described with respect to a specific embodiment for a complete and clear disclosure, the appended claims are not to be thus limited but are to be cons-trued as embodying all modifications and alternative constructions that may occur to one skilled in the art which fairly fall within the basic teaching herein set forth.

What is claimed is:

1. A phase lock loop (PLL) circuit comprising:
   an oscillation circuit operating in synchronism with a horizontal synchronizing signal;
   a DC level decision unit for deciding a DC level of a vertical synchronizing signal during a return period; and
   a logic circuit for automatically selecting said oscillation circuit according to the DC level decided in said DC level decision unit.

2. The PLL circuit according to claim 1, wherein said oscillation circuit includes an amplifier and a voltage controlled oscillation circuit to which a signal is input from said amplifier.

3. The PLL circuit according to claim 2, wherein said oscillation circuit includes a plurality of amplifiers and voltage controlled oscillation circuits.

4. A phase lock loop (PLL) circuit comprising:
   an oscillation circuit operating in synchronism with a horizontal synchronizing signal;
   a DC level decision unit for deciding a DC level of a signal during a period when a display of display information on a monitor screen is off; and
   a logic circuit for automatically selecting said oscillation circuit according to the DC level decided in said DC level decision unit.

5. The PLL circuit according to claim 4, wherein said oscillation circuit includes an amplifier and a voltage controlled oscillation circuit to which a signal is input from said amplifier.

6. The PLL circuit according to claim 5, wherein said oscillation circuit includes a plurality of amplifiers and voltage controlled oscillation circuits.

7. A chase lock loop (PLL) circuit comprising:
   a frequency-dividing circuit for frequency dividing a clock to produce a divided clock;
   a phase comparator for comparing the phase of the divided clock with the phase of a horizontal synchronizing signal;
   a charge pump circuit charging or discharging in response to an error signal output from said phase comparator;
   a loop filter receiving output data from said charge pump circuit;
   a DC level decision circuit for deciding a DC level of a signal output from said loop filter;
   a logic circuit for receiving output data from said DC level decision circuit; and
   an oscillation circuit for outputting oscillation characteristics according to output signals from said logic circuit and from said loop filter.

8. The PLL circuit according to claim 7, wherein said oscillation circuit includes a plurality of amplifiers and voltage controlled oscillation circuits.

* * * * *

UNITED STATES PATENT AND TRADEMARK OFFICE
CERTIFICATE OF CORRECTION

PATENT NO.  : 6,246,292 B1
DATED       : June 12, 2001
INVENTOR(S) : Naoki Ono

It is certified that error appears in the above-identified patent and that said Letters Patent is hereby corrected as shown below:

Item [73] Assignee: Mitsubishi Denki Kabushiki Kaisha of Tokyo, Japan

And

Mitsubishi Electric System LSI Design Corporation of Hyogo, Japan

Signed and Sealed this

Second Day of October, 2001

Attest:

NICHOLAS P. GODICI
*Attesting Officer*    *Acting Director of the United States Patent and Trademark Office*